(12) United States Patent
Lee

(10) Patent No.: US 12,016,193 B2
(45) Date of Patent: Jun. 18, 2024

(54) WINDOW AND DISPLAY DEVICE INCLUDING THE SAME

(71) Applicant: Samsung Display Co., LTD., Yongin-si (KR)

(72) Inventor: Kyoung-Eun Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 139 days.

(21) Appl. No.: 17/074,681

(22) Filed: Oct. 20, 2020

(65) Prior Publication Data

US 2021/0126219 A1     Apr. 29, 2021

(30) Foreign Application Priority Data

Oct. 29, 2019   (KR) ................. 10-2019-0135809

(51) Int. Cl.
*H01L 51/52*       (2006.01)
*B32B 7/12*        (2006.01)
*B32B 17/10*       (2006.01)
*H10K 50/84*       (2023.01)
*H10K 50/86*       (2023.01)
*H10K 59/12*       (2023.01)
*H10K 59/40*       (2023.01)
*H10K 77/10*       (2023.01)
*H10K 102/00*      (2023.01)

(52) U.S. Cl.
CPC ............ *H10K 50/841* (2023.02); *B32B 7/12* (2013.01); *B32B 17/10* (2013.01); *H10K 50/86* (2023.02); *H10K 59/12* (2023.02); *H10K 59/40* (2023.02); *H10K 77/111* (2023.02); *B32B 2307/40* (2013.01); *B32B 2457/20* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 7,656,088 B2 * | 2/2010 | Lee .................. | H01L 51/524 313/506 |
| 9,444,070 B2 | 9/2016 | Lee | |
| 9,804,312 B2 | 10/2017 | Yang | |
| 10,295,818 B2 | 5/2019 | Nam et al. | |
| 10,620,756 B2 | 4/2020 | Lee et al. | |
| 2009/0135150 A1 * | 5/2009 | Takashima ........ | B32B 27/365 345/173 |
| 2014/0202531 A1 * | 7/2014 | Oya ................... | C09D 7/70 252/514 |
| 2014/0292184 A1 * | 10/2014 | Lee .................... | H01L 27/32 313/504 |
| 2015/0070598 A1 | 3/2015 | Kim et al. | |

(Continued)

FOREIGN PATENT DOCUMENTS

KR     1020140117960 A     10/2014
KR       20150028647 A      3/2015

(Continued)

*Primary Examiner* — Anthony J Frost
(74) *Attorney, Agent, or Firm* — CANTOR COLBURN LLP

(57) ABSTRACT

A window includes a base substrate defining a recess and a functional layer disposed in the recess of the base substrate. The functional layer is disposed in a first recess defined in a top surface of the base substrate.

19 Claims, 10 Drawing Sheets

(56) References Cited

U.S. PATENT DOCUMENTS

| | | | |
|---|---|---|---|
| 2015/0090969 A1* | 4/2015 | Han | H01L 51/524 257/40 |
| 2015/0285985 A1* | 10/2015 | Shin | G02B 6/0073 29/601 |
| 2017/0115446 A1* | 4/2017 | Hirayama | G02B 6/0053 |
| 2018/0113525 A1* | 4/2018 | Kweon | G06F 3/041 |

FOREIGN PATENT DOCUMENTS

| | | |
|---|---|---|
| KR | 1020150061965 A | 6/2015 |
| KR | 20160078665 A | 7/2016 |
| KR | 20170008371 A | 1/2017 |
| KR | 20180044618 A | 5/2018 |
| KR | 1020180132201 A | 12/2018 |

\* cited by examiner

WINDOW AND DISPLAY DEVICE INCLUDING THE SAME

This application claims priority to Korean Patent Application No. 10-2019-0135809, filed on Oct. 29, 2019, and all the benefits accruing therefrom under 35 U.S.C. § 119, the entire contents of which are hereby incorporated by reference.

BACKGROUND

(1) Field

The present disclosure herein relates to a window and a display device including the same. More particularly, the present disclosure herein relates to a window for which a thickness is reduced and a peeling (or delamination) and lifting phenomena of a functional layer is reduced or effectively prevented, and a display device including the same.

(2) Description of the Related Art

Typically, a display device may include a display panel including a plurality of pixels to display an image, and a window which is disposed on the display panel to protect the display panel. The window may include or be formed of glass or a transparent plastic material.

SUMMARY

The present disclosure may provide a window having a reduced thickness and in which a peeling and lifting phenomena of a functional layer is reduced or effectively prevented, and a display device including the same.

In an embodiment, a window may include a base substrate including a transmission area through which light from a display panel is transmitted, a light blocking area adjacent to the transmission area, a boundary between the transmission area and the light blocking area, a top surface furthest from the display panel, and a first recess in the transmission area. The first recess is defined by: an inclined surface extended from the top surface and in a direction from the boundary to the transmission area, and a flat surface extended from an end of the inclined surface; and a functional layer which receives light from the base substrate and transmits the light from the base substrate to outside the window. The functional layer is disposed in the first recess.

In an embodiment of the invention, a display device may include a display panel from which light is emitted; and a window which receives the light from the display panel and through which the light from the display panel is transmitted to outside the display device. The window includes: a base substrate including: a transmission area through which the light from the display panel is transmitted, a light blocking area adjacent to the transmission area, a boundary between the transmission area and the light blocking area, a top surface furthest from the display panel, and a first recess in the transmission area. The first recess is defined by: an inclined surface extended from the top surface and in a direction from the boundary to the transmission area, and a flat surface extended from an end of the inclined surface; and a functional layer which receives light from the base substrate and transmits the light from the base substrate to outside the window. The functional layer is disposed in the first recess.

In an embodiment of the invention, a display device may include a display panel from which light is emitted; and a window which receives the light from the display panel and through which the light from the display panel is transmitted to outside the display device. The window includes: a base substrate including: a transmission area through which the light from the display panel is transmitted, a light blocking area adjacent to the transmission area, a boundary between the transmission area and the light blocking area, a bottom surface closest to the display panel, and a recess in the transmission area. The recess is defined by: an inclined surface extended from the bottom surface and in a direction from the boundary to the transmission area, and a flat surface extended from an end of the inclined surface; a functional layer which receives light from the base substrate and transmits the light from the base substrate to outside the window; and an anti-scattering layer which minimizes scattering of broken fragments of the base substrate. The anti-scattering layer is in the recess.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
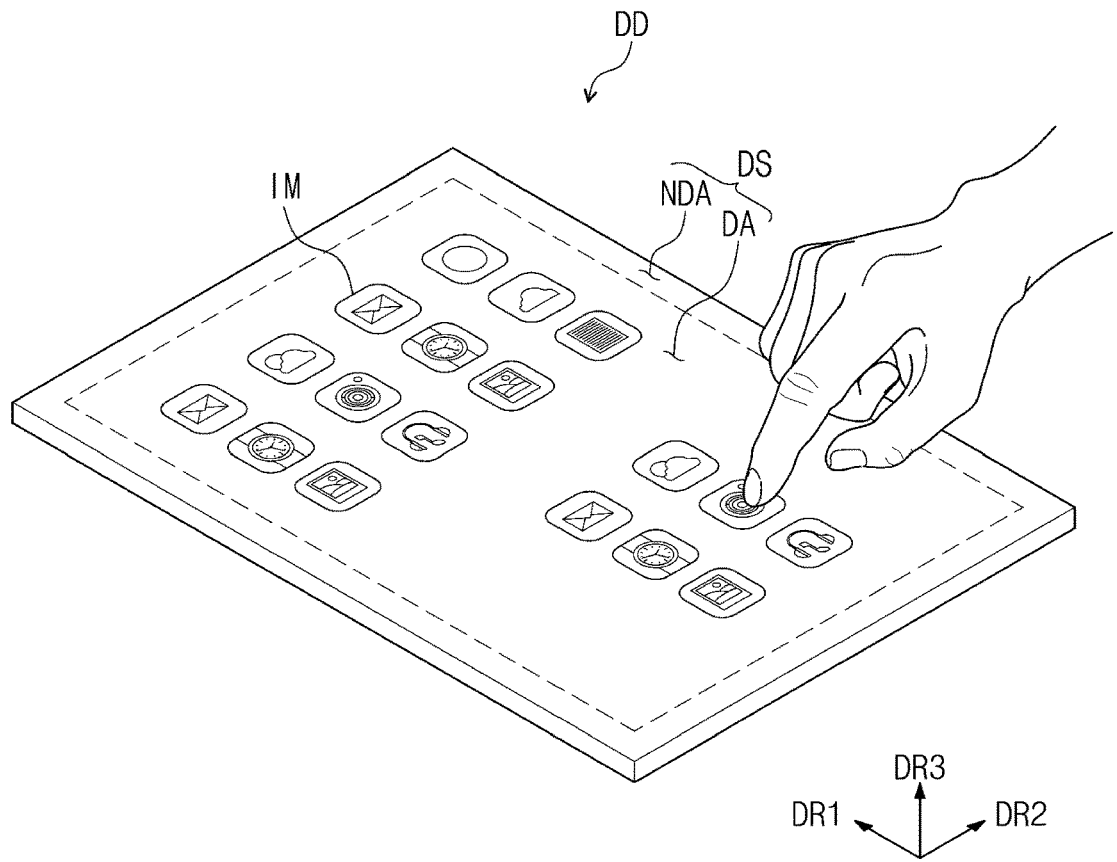
FIG. 1 is a perspective view illustrating an embodiment of a display device.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being related to another element such as being "on" another element, it can be directly on the other element or intervening elements may be present. In contrast, the term "directly" means that there are no intervening elements. As an element is referred to as being "directly" related to another element, an interface may be formed between such elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

A window WIN of a display device DD may protect a display panel DP from an external scratch and impact. The window WIN may be adhered to the display panel DP such as by an adhesive OCA. An image IM generated by the display panel DP may be transmitted through the window WIN so as to be provided to outside the display device DD. The window WIN may include a base substrate BS and a functional layer AL which is disposed on the base substrate BS. Since the functional layer AL is disposed on the base substrate BS, a thickness of the window WIN may be increased. As such, a window WIN having a reduced thickness is being developed.

Hereinafter, embodiments will be described in detail with reference to the accompanying drawings.

Figure 2:
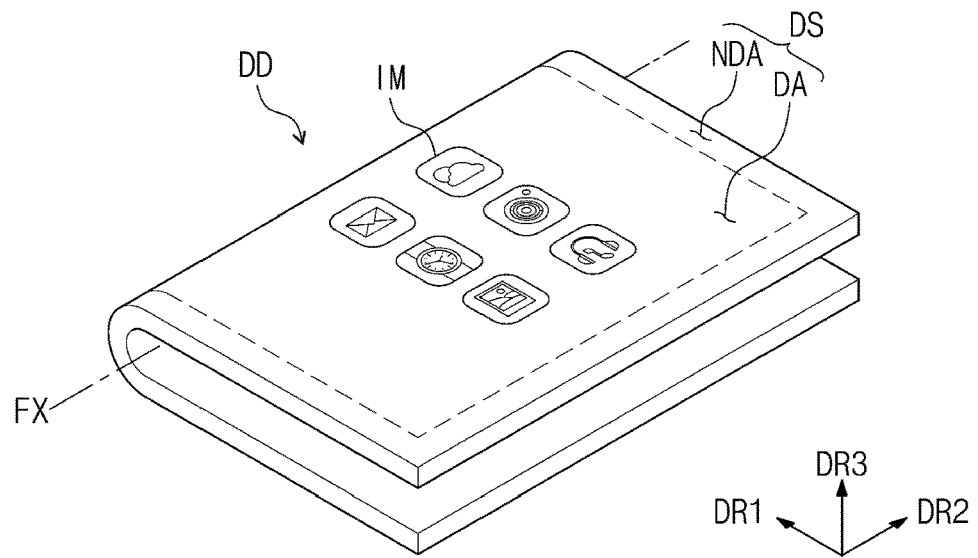
FIG. 2 is a perspective view illustrating the display device of FIG. 1 which is folded.
Figure 3:
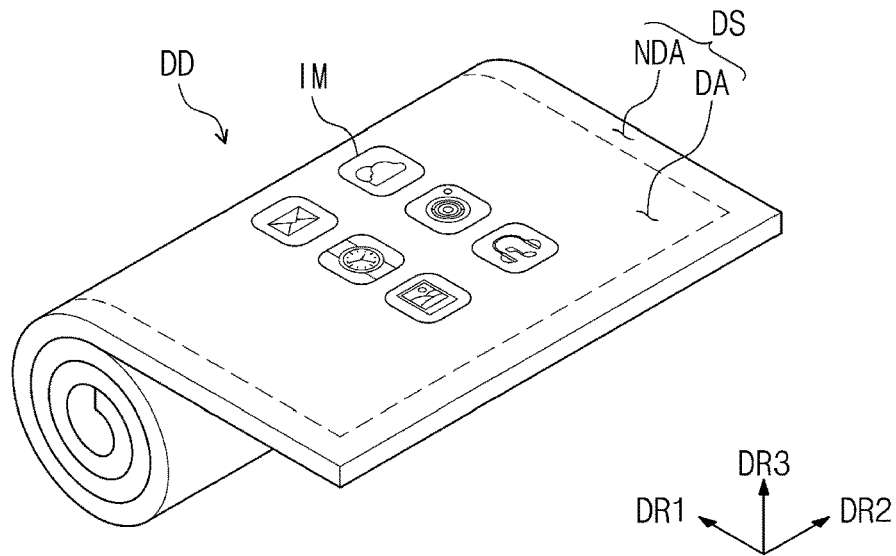
FIG. 3 is a perspective view illustrating the display device of FIG. 1 which is rolled.

FIG. 1 is a perspective view illustrating an embodiment of a display device DD which is unfolded. FIG. 2 is a perspective view illustrating an embodiment of the display device DD of FIG. 1 which is folded. FIG. 3 is a perspective view illustrating an embodiment of the display device DD of FIG. 1 which is rolled.

Referring to FIG. 1, a display device DD may have a rectangular shape in a top plan view which is defined by relatively long sides extending along a first direction DR1 and relatively short sides extending along a second direction DR2 which intersects the first direction DR1. However, embodiments are not limited thereto. In embodiments, the display device DD may have one of other various shapes in a top plan view (e.g., planar shape) such as a circular shape and a polygonal shape.

Hereinafter, a direction crossing or intersecting a plane defined by the first and second directions DR1 and DR2 may be defined as a third direction DR3. In an embodiment, the third direction DR3 may be substantially perpendicular to the plane defined by the first and second directions DR1 and DR2. In the present specification, it may be understood that when one or more components are viewed in a top plan view, it is a view in a direction opposite to the third direction DR3 indicated in the Figures.

A top surface of the display device DD may be defined as a display surface DS and may be disposed in a plane defined by the first direction DR1 and the second direction DR2. An image IM generated by the display device DD may be provided to outside the display device DD through the display surface DS.

The display surface DS may include a display area DA and a non-display area NDA which is adjacent to the display area DA. The display area DA is a planar area in which an image IM is displayed, while the non-display area NDA is a planar area in which the image IM is not displayed. The non-display area NDA may surround the display area DA in a top plan view and may define a border of the display device DD. The non-display area NDA may be defined by a material which is printed and has a predetermined color.

The display device DD may be flexible. The display device DD may be foldable, such as being foldable and unfoldable repeatedly. The display device DD may be rollable, such as being rollable into a scroll shape and unrollable into a flat shape, repeatedly. The display device DD and components thereof may include a display area DA and a non-display area NDA corresponding to those described above for the display surface DS.

The display device DD may be used in relatively large-sized electronic devices such as televisions, monitors and external billboards. In embodiments, the display device DD may be used in relatively small and middle-sized electronic devices such as personal computers, notebook computers, personal digital assistants, car navigation units, game consoles, smart phones, tablets and cameras. However, these are provided only as embodiments. In embodiments, the display device DD may be used in other various electronic devices without departing from the spirit and scope of the invention.

Referring to FIG. 2, the display device DD may be foldable about a folding axis FX parallel to the second direction DR2. However, embodiments are not limited thereto. In another embodiment, the display device DD may be foldable about a folding axis FX parallel to the first direction DR1.

The display device DD may be out-folded in such a way that portions of the display surface DS face outside the display device DD. However, embodiments are not limited thereto. In another embodiment, the display device DD may be in-folded in such a way that portions of the display surface DS face each other in a direction away from the outside.

Referring to FIG. 3, the display device DD may be rollable in a direction from a first side (e.g., outer side) of the display device DD toward a second side opposite to the first side. The display device DD may be rolled in such a way that the display surface DS faces outside the display device DD. Alternatively, the display device DD may be rolled in such a way that the display surface DS faces in a direction opposite to the outside.

Figure 4:
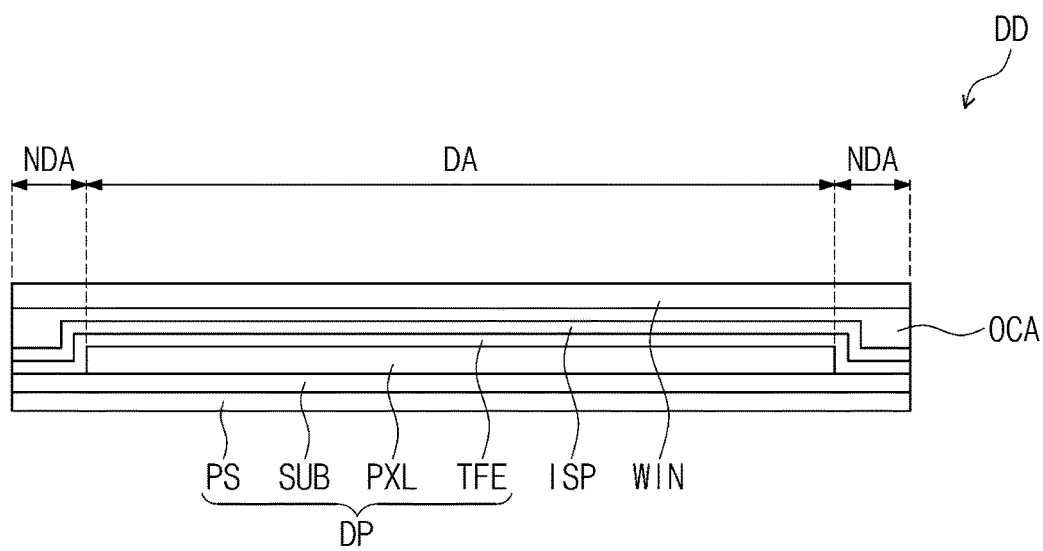
FIG. 4 is a cross-sectional view schematically illustrating an embodiment of the display device of FIG. 1.

FIG. 4 is a cross-sectional view schematically illustrating an embodiment of the display device DD of FIG. 1. The display device DD in FIG. 1 is disposed flat, such as after being unfolded or unrolled.

Referring to FIG. 4, the display device DD may include a display panel DP, an input sensing unit ISP (e.g., input sensing layer) disposed on the display panel DP, a window WIN disposed on the input sensing unit ISP, and a fixing member such as an adhesive OCA (e.g., adhesive layer) disposed between the input sensing unit ISP and the window WIN to couple the input sensing unit ISP and the window WIN to each other.

The display panel DP may generate light and emit the light (e.g., light emitting type). For example, the display panel DP may be an organic light emitting display panel or a quantum-dot light emitting display panel. An emission layer of the organic light emitting display panel may include an organic light emitting material. An emission layer of the quantum-dot light emitting display panel may include quantum dots and/or quantum rods. Hereinafter, the display panel DP which is the organic light emitting display panel will be described as an example.

The display panel DP may include a substrate SUB, a pixel layer PXL (e.g., image display layer) disposed on the substrate SUB, an encapsulation layer such as a thin film encapsulation layer TFE disposed on the substrate SUB to cover the pixel layer PXL, and a protective substrate PS (e.g., protective layer) disposed under the substrate SUB. The substrate SUB may be a transparent substrate and may include a flexible plastic substrate. In an embodiment, for example, the substrate SUB may include polyimide ("PI").

The substrate SUB may include a display area DA and a non-display area NDA which is adjacent to the display area DA, similar to that described for the display surface DS of the display device DD. The pixel layer PXL may be disposed on the display area DA. The pixel layer PXL may include a plurality of pixels, and each of the pixels may include a light emitting element which generates light and/or emits light.

The thin film encapsulation layer TFE may include at least two inorganic layers and an organic layer which is disposed between the inorganic layers. The inorganic layers may include an inorganic material and may protect the pixel layer PXL from moisture and/or oxygen. The organic layer may include an organic material and may protect the pixel layer PXL from a foreign material such as dust particles.

The protective substrate PS may protect a bottom of the substrate SUB. The protective substrate PS may include a flexible plastic substrate. In an embodiment, for example, the protective substrate PS may include polyethylene terephthalate ("PET"). The protective substrate PS may define an outer surface of the display device DD without being limited thereto.

The input sensing unit ISP may sense an external input (e.g., a touch or contact by an input tool such as a user's hand or finger or a touch pen) and convert the external input into an electrical signal such as an input signal, and may provide the input signal to the display panel DP. The input sensing unit ISP may include a plurality of sensor parts or sensors (not shown) with which the external input is sensible. The sensor parts may sense the external input by a capacitive method. The display panel DP may receive the input signal from the input sensing unit ISP and may generate an image IM corresponding to the input signal.

The input sensing unit ISP may be attached to the display panel DP, without be limited thereto. In an embodiment of manufacturing the display device DD, the input sensing unit ISP may be provided or manufactured directly on the thin film encapsulation layer TFE, in a process of manufacturing the display panel DP. However, embodiments are not limited thereto. In another embodiment, the input sensing unit ISP may be provided or manufactured separately from the display panel DP and may be subsequently connected or fixed to the display panel DP by a fixing member such as an adhesive OCA.

The window WIN may protect the display panel DP and the input sensing unit ISP from an external scratch and impact. The window WIN may be fixed to the input sensing unit ISP by a fixing member like the adhesive OCA. The adhesive OCA may include an optical clear adhesive. An image IM generated from the display panel DP may be transmitted through the window WIN so as to be viewable from outside the display device DD. The window WIN may define an outer surface of the display device DD without being limited thereto.

Figure 5:
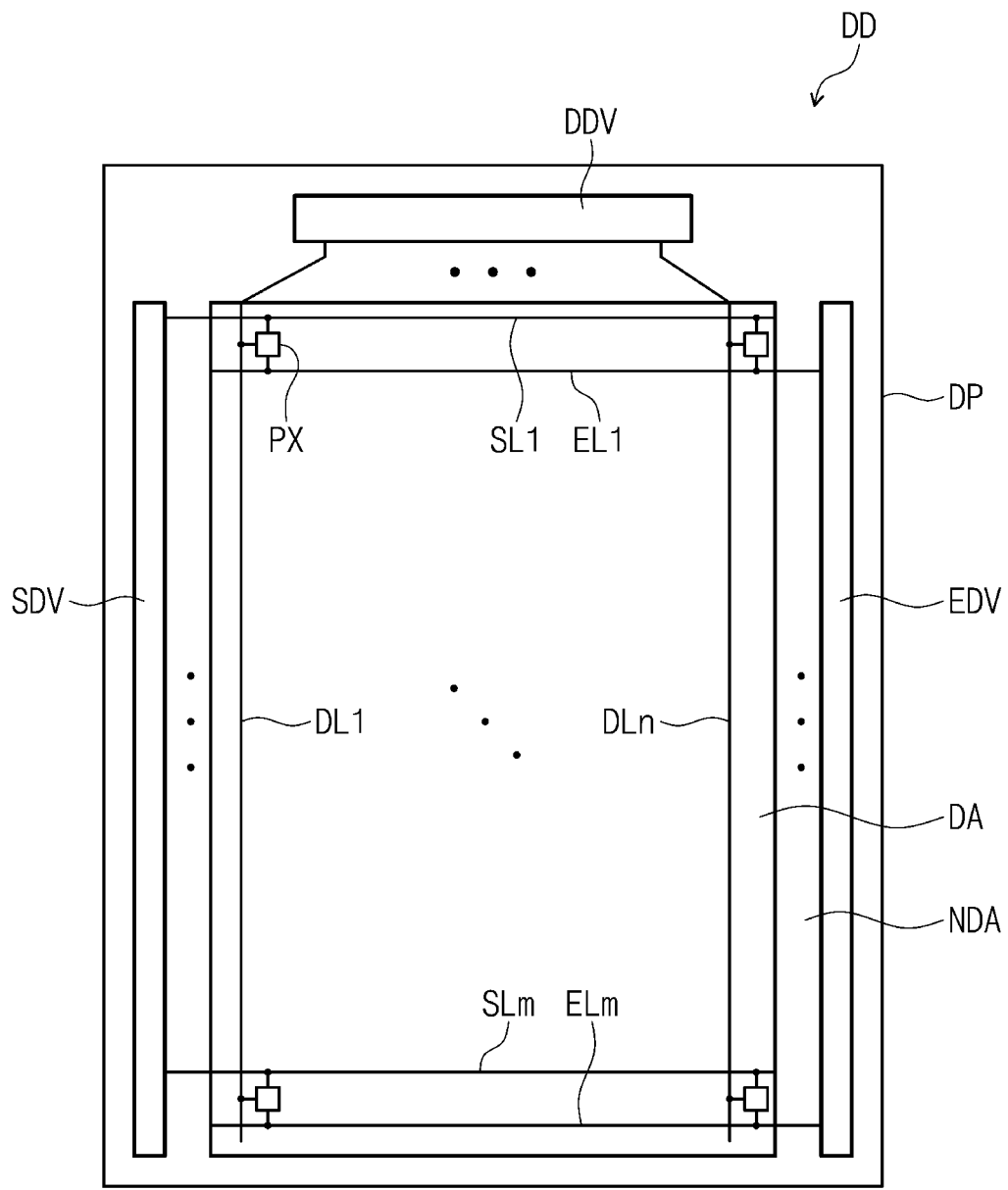
FIG. 5 is a top plan view illustrating an embodiment of a display panel of FIG. 4.

FIG. 5 is a top plan view illustrating an embodiment of a display panel DP of FIG. 4.

Referring to FIG. 5, the display device DD may include the display panel DP, a scan driver SDV, a data driver DDV, and an emission driver EDV.

The display panel DP may be flexible. The display panel DP may have a rectangular shape defined by relatively long sides extending along the first direction DR1 and relatively short sides extending along the second direction DR2. The display panel DP may include the display area DA and the non-display area NDA which is adjacent to the display area DA, such as to surround the display area DA.

The display panel DP may include a pixel PX provided in plurality (e.g., a plurality of pixels PX), a scan line provided in plurality (e.g., a plurality of scan lines SL1 to SLm), a data line provided in plurality (e.g., a plurality of data lines DL1 to DLn), and an emission line provided in plurality (e.g., a plurality of emission lines EL1 to Elm). Here, 'm' and 'n' are natural numbers. The pixels PX may be disposed in the display area DA and may be connected to corresponding lines among the scan lines SL1 to SLm, the data lines DL1 to DLn, and the emission lines EL1 to ELm.

The scan driver SDV, the data driver DDV and the emission driver EDV may be disposed in the non-display area NDA. The scan driver SDV and the emission driver EDV may be disposed adjacent to the long sides of the display panel DP, respectively.

The data driver DDV may be provided or manufactured in the form of an integrated circuit chip and may be disposed adjacent to one of the short sides of the display panel DP. However, embodiments are not limited thereto. In another embodiment, the data driver DDV may be provided or mounted on a flexible circuit board (not shown) which is separate from the display panel and may subsequently be connected to the display panel DP through the flexible circuit board.

The scan lines SL1 to SLm may extend along the second direction DR2 and may be connected to the scan driver SDV. The data lines DL1 to DLn may extend along the first direction DR1 and may be connected to the data driver DDV. The emission lines EL1 to ELm may extend along the second direction DR2 and may be connected to the emission driver EDV.

The scan driver SDV may generate electrical signals such as a plurality of scan signals, and the scan signals may be applied to the pixels PX through the scan lines SL1 to SLm. The scan signals may be applied sequentially to the pixels PX. The data driver DDV may generate electrical signals such as a plurality of data voltages, and the data voltages may be applied to the pixels PX through the data lines DL1 to DLn. The emission driver EDV may generate electrical signals such as a plurality of emission signals, and the emission signals may be applied to the pixels PX through the emission lines EL1 to ELm.

Even though not shown in the drawings, the display device DD may further include a timing controller (not shown) for controlling operations of the scan driver SDV, the data driver DDV and the emission driver EDV. The timing controller may be connected to a respective driver and/or the display panel DP for controlling operations thereof.

The pixels PX may receive the data voltages in response to the scan signals. The pixels PX may generate and/or emit light having brightness corresponding to the data voltages in response to the emission signals, thereby displaying an image IM. Emission times of the pixels PX may be controlled by the emission signals.

Figure 6:
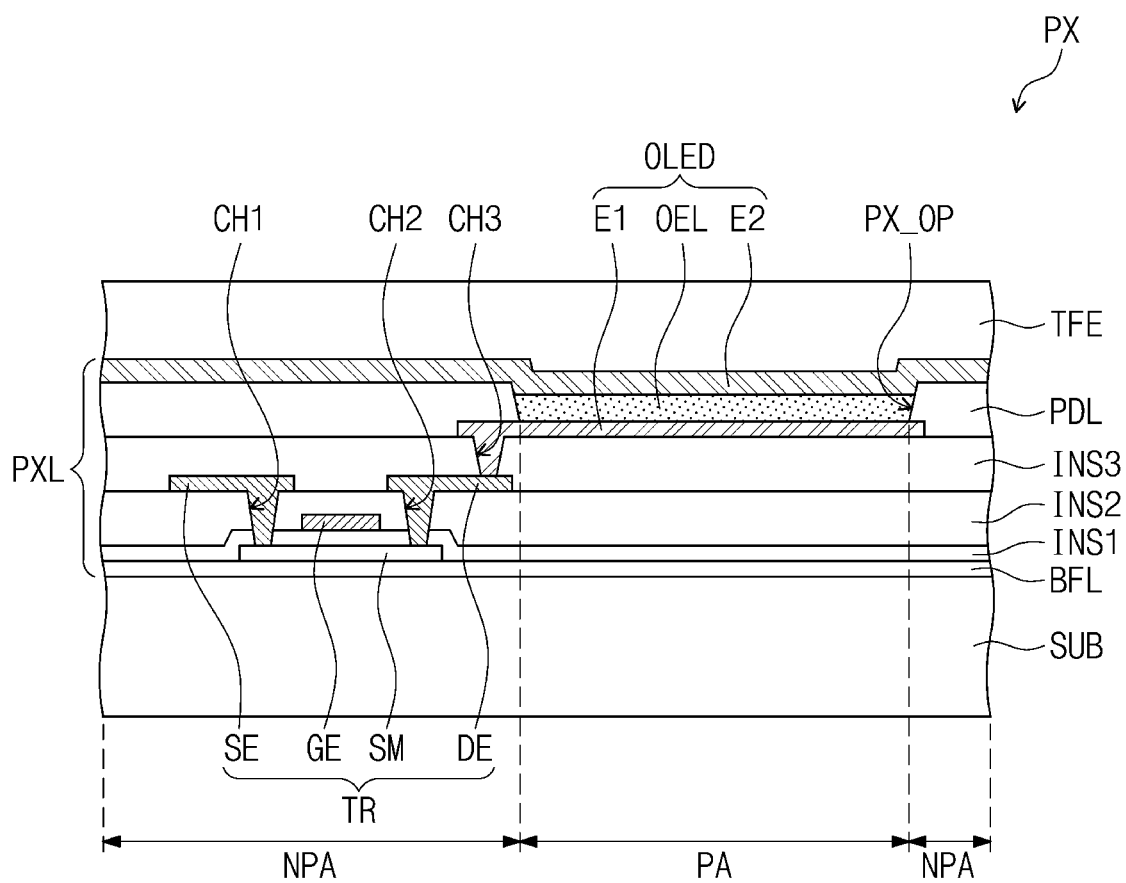
FIG. 6 is an enlarged cross-sectional view schematically illustrating an embodiment of a pixel of FIG. 5.

FIG. 6 is an enlarged cross-sectional view schematically illustrating an embodiment of a pixel PX of FIG. 5.

Referring to FIG. 6, the pixel PX may include a light emitting element (or a display element) such as an organic light emitting element OLED, and a transistor TR which is connected to the organic light emitting element OLED. The organic light emitting element OLED may include a first electrode E1, a second electrode E2, and an organic emission layer OEL disposed between the first electrode E1 and the second electrode E2. The transistor TR is connected to the light emitting element and controls the light emitting element to generate light, emit light, display an image, etc.

The first electrode E1 may be an anode, and the second electrode E2 may be a cathode. The first electrode E1 may be defined as a pixel electrode, and the second electrode E2 may be defined as a common electrode.

The pixel PX may be divided into a pixel area PA and a non-pixel area NPA which is adjacent to the pixel area PA, such as being around the pixel area PA. The organic light emitting element OLED may be disposed in the pixel area PA, and the transistor TR may be disposed in the non-pixel area NPA. The transistor TR and the organic light emitting element OLED may be disposed on the substrate SUB. A buffer layer BFL may be disposed on the substrate SUB. The buffer layer BFL may include an inorganic material.

A semiconductor layer SM of the transistor TR may be disposed on the buffer layer BFL. The semiconductor layer SM may include an inorganic semiconductor material (e.g., amorphous silicon or poly-crystalline silicon) or an organic semiconductor material. Alternatively, the semiconductor layer SM may include an oxide semiconductor material. Even though not shown in FIG. 6, the semiconductor layer SM may include a source region, a drain region, and a channel region which is between the source region and the drain region.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 and may overlap with or correspond to the semiconductor layer SM. The gate electrode GE may be disposed to overlap with or correspond to the channel region of the semiconductor layer SM.

A second insulating layer IN2 may be disposed on the first insulating layer INS1 to cover the gate electrode GE. The second insulating layer IN2 may include an organic material and/or an inorganic material.

A source electrode SE and a drain electrode DE of the transistor TR may be spaced apart from each other along the second insulating layer IN2. The source electrode SE may be connected to the source region of the semiconductor layer SM at or through a first contact hole CH1 defined in the first and second insulating layers INS1 and INS2. The drain electrode DE may be connected to the drain region of the semiconductor layer SM at or through a second contact hole CH2 defined in the first and second insulating layers INS1 and INS2.

A third insulating layer INS3 may be disposed on the second insulating layer INS2 to cover the source electrode SE and the drain electrode DE of the transistor TR. The third insulating layer INS3 may be defined as a planarization layer which provides a flat top surface, and may include an organic material.

The first electrode E1 may be disposed on the third insulating layer INS3. The first electrode E1 may be connected to the drain electrode DE of the transistor TR at or through a third contact hole CH3 defined in the third insulating layer INS3.

A pixel defining layer PDL exposing a portion of the first electrode E1, may be disposed on the first electrode E1 and the third insulating layer INS3. An opening PX_OP exposing the portion of the first electrode E1, may be defined in the pixel defining layer PDL. The opening PX_OP may correspond to the pixel area PA, at the first electrode E1.

The organic emission layer OEL may be disposed on the first electrode E1 and in the opening PX_OP. The organic emission layer OEL may be a light emission layer with which red light, green light and/or blue light is generated and emitted. However, embodiments are not limited thereto. In other embodiments, the organic emission layer OEL may generate white light by a combination of organic materials with which red light, green light and blue light are respectively generated.

The second electrode E2 may be disposed on the pixel defining layer PDL and the organic emission layer OEL. The thin film encapsulation layer TFE may be disposed on the organic light emitting element OLED to cover layers or elements within the pixel PX. A layer between the substrate SUB and the thin film encapsulation layer TFE may be defined as the pixel layer PXL.

A first voltage (ELVDD) may be applied to the first electrode E1, and a second voltage (ELVSS) may be applied to the second electrode E2. Holes and electrons injected in the organic emission layer OEL may be combined with each other to generate excitons, and the excitons may transition from an excited state to a ground state to emit light from the organic light emitting element OLED. The organic light emitting element OLED may emit one of the red light, the green light and the blue light by a flow of electrical current, and thus an image IM may be displayed.

Figure 7:
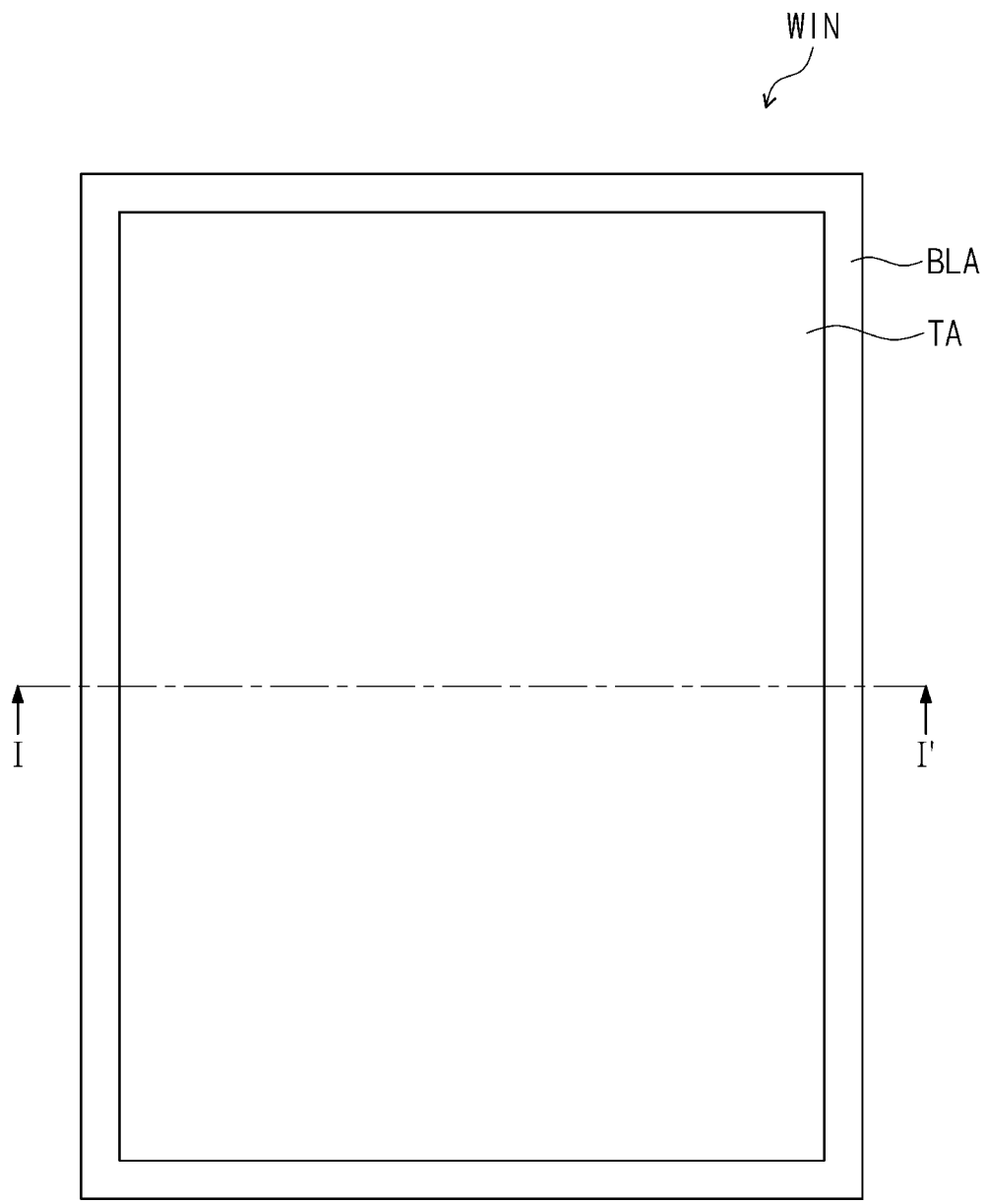
FIG. 7 is a top plan view illustrating an embodiment of a window of FIG. 4.

FIG. 7 is a plan view illustrating an embodiment of a window WIN of FIG. 4.

Referring to FIG. 7, the window WIN may have a rectangular shape defined by relatively long sides extending along the first direction DR1 and relatively short sides extending along the second direction DR2. The window WIN may include a transmission area TA (e.g., light transmission area) and a light blocking area BLA which is adjacent to the transmission area TA, such as being around the transmission area TA to surround the transmission area TA in a top plan view.

Even though not shown in FIG. 7, the display area DA of the display panel DP may overlap with or correspond to the transmission area TA of the window WIN, and the non-display area NDA of the display panel DP may overlap with or correspond to the light blocking area BLA of the window WIN.

The transmission area TA may be a planar area of the window WIN at which light is transmittable, and the light blocking area BLA may be a planar area of the window WIN at which light is blocked (e.g., not transmittable). The light blocking area BLA may be defined by a material which is printed and has a predetermined color. In an embodiment, for example, the light blocking area BLA may include or be defined by a printed material having a black color to block light transmission through the window at the light blocking area BLA. Alternatively, the light blocking area BLA may include or be defined by a printed material with at least one of other various colors except the black color.

Figure 8:
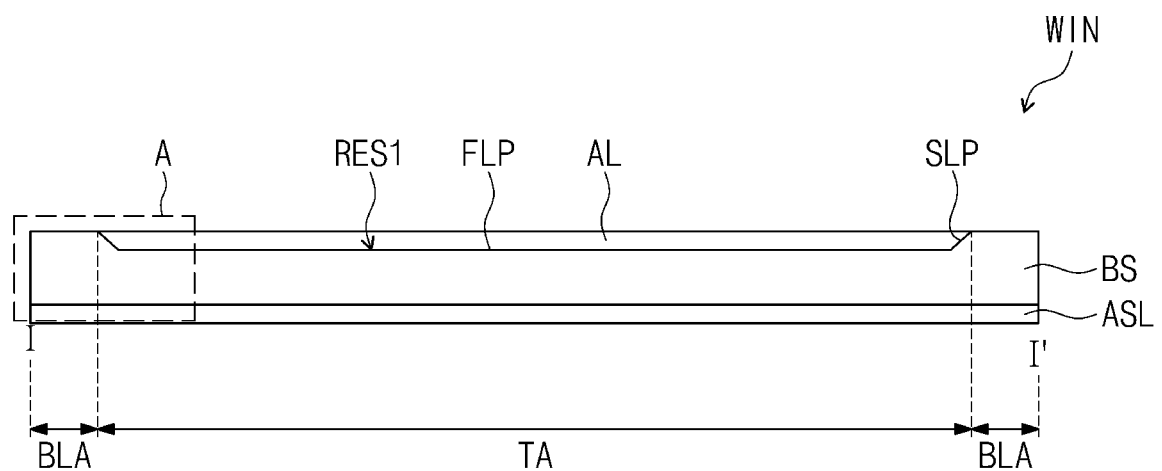
FIG. 8 is an enlarged cross-sectional view taken along line I-I' of FIG. 7.
Figure 8:
Figure 8:
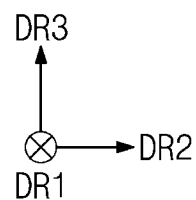
Figure 9:
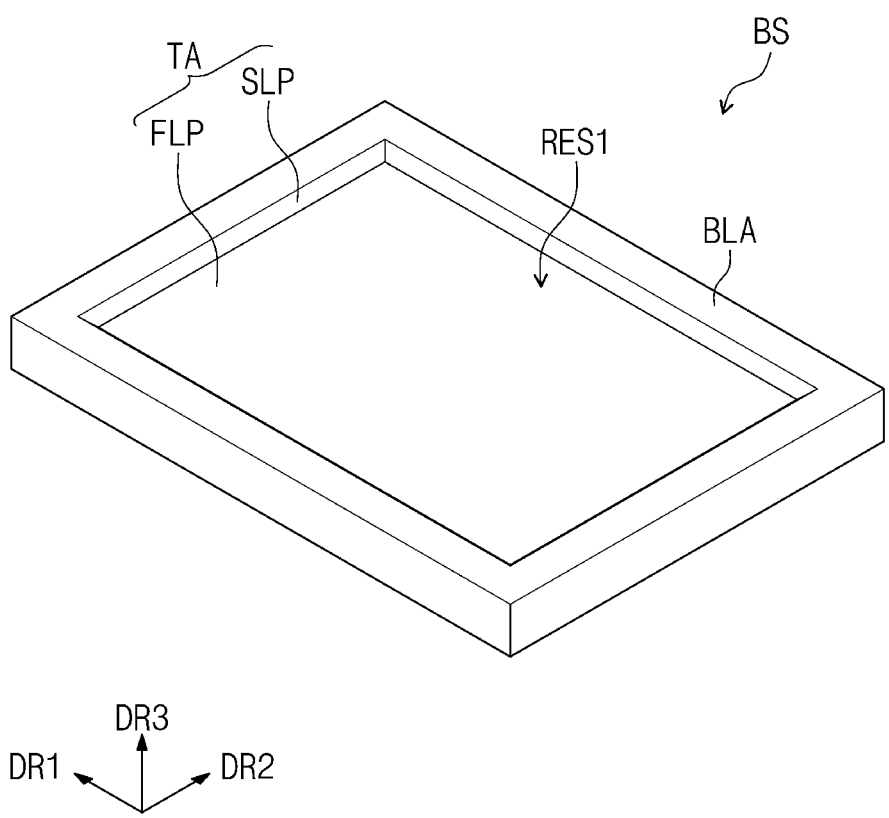
FIG. 9 is a perspective view illustrating an embodiment of a base substrate of FIG. 8.

FIG. 8 is a cross-sectional view of the window WIN taken along line I-I' of FIG. 7. FIG. 9 is a perspective view illustrating a base substrate BS of the window WIN in FIG. 8.

For the purpose of ease and convenience in explanation, the display panel DP and the input sensing unit ISP are illustrated together with the window WIN in FIG. 8.

Referring to FIGS. 8 and 9, the window WIN may include a base substrate BS, a functional layer AL disposed on the base substrate BS, and an anti-scattering layer ASL disposed under the base substrate BS. A first recess RES1 may be defined extended from a top surface of the base substrate BS and toward the anti-scattering layer ASL, and the functional layer AL may be disposed in the first recess RES1. In an embodiment, the functional layer AL receives light from the base substrate BS and transmits the light from the base substrate BS to outside the window WIN.

The base substrate BS may include the transmission area TA and the light blocking area BLA which is adjacent to the transmission area TA, such as being around the transmission area TA. The first recess RES1 may be defined recessed from a top surface of the base substrate BS at the transmission area TA thereof. The top surface of the base substrate BS at the transmission area TA, from which the first recess RES1 is defined, may be lower than a top surface of the base substrate BS at the light blocking area BLA. A bottom surface of the base substrate BS the transmission area TA and a bottom surface of the base substrate BS at the light blocking area BLA may be coplanar with each other and may define a single-plane bottom surface of the base substrate BS. The bottom surface of the base substrate BS is opposite to the top surface thereof. The bottom surface and/or the bottom surface of the base substrate BS may define a plane to which a thickness direction is perpendicular.

The base substrate BS may include glass. In an embodiment of manufacturing a display device DD, a portion of the base substrate BS which corresponds to the transmission area TA may be etched in a direction from a top surface of the base substrate BS to a predetermined depth, and thus the first recess RES1 may be provided or formed. The base substrate BS may be defined as ultra-thin glass ("UTG").

The top surface of the base substrate BS at the transmission area TA may include a flat portion FLP (e.g., flat surface or flat surface) lower than the top surface of the base substrate BS at the light blocking area BLA, and an inclined portion SLP which is adjacent to the flat portion FLP such as to be surrounding the flat portion FLP. In an embodiment, for example, the flat portion FLP may have a quadrilateral shape (e.g., a rectangular shape) in a top plan view. However, the shape of the flat portion FLP is not limited thereto. The flat portion FLP may extend from an end of the inclined portion SLP. The inclined portion SLP may be defined by an inclined surface (e.g., inclined surface) of the base substrate BS which is inclined from a boundary between the transmission area TA and the light blocking area BLA, and toward the flat portion FLP. The flat portion FLP and the inclined portion SLP may together define the first recess RES1. An overall upper surface of the base substrate BS may include the flat portion FLP and the inclined portion SLP together with the top surface at the light blocking area BLA. The top surface of the base substrate BS at the light blocking area BLA may be furthest from the display panel DP, while the bottom surface of the base substrate BS at the light blocking area BLA may be closest to the display panel DP.

The functional layer AL may provide various functions to the window WIN. In an embodiment, for example, the functional layer AL may provide an anti-fingerprint function, an anti-fouling function, an anti-reflection function, an anti-glare function, and/or a protection function relative to the base substrate BS of the window WIN. A stack structure of the functional layer AL will be described later in detail. The functional layer AL may define or provide an outer surface of the window WIN. The functional layer AL together with the base substrate BS at the light blocking area BLA may together define or provide an outer surface of the window WIN.

The functional layer AL may be directly on the top surface of the base substrate BS in which the first recess RES1 is defined. The functional layer AL may include a functional layer material with is directly coated on the base substrate BS. In an embodiment, for example, the functional layer AL may be directly on the flat portion FLP and the inclined portion SLP of the base substrate BS at the transmission area TA. However, embodiments are not limited thereto. In another embodiment, the functional layer AL may be provided in the form of a film which is separate from the base substrate BS, and may be coupled to the base substrate BS through a fixing member such as an adhesive OCA. The functional layer AL may include a material which is coated on the base substrate BS by at least one of various coating methods such as a spin coating method, an inkjet coating method, and a bar coating method.

The anti-scattering layer ASL may be directly on the bottom surface of the base substrate BS. The anti-scattering layer ASL may include an anti-scattering layer material with is directly coated on the base substrate BS. However, embodiments are not limited thereto. In another embodiment, the anti-scattering layer ASL may be provided in the form of a film which is separate from the base substrate BS, and may be coupled to the bottom surface of the base substrate BS such as through an adhesive OCA. The anti-scattering layer ASL may provide a function which reduces or effectively prevents scattering of fragments of the base substrate BS which is broken. That is, where the base substrate BS is breakable, the anti-scattering layer ASL coupled to the base substrate BS which is broken, minimizes scattering of broken fragments of the base substrate BS from original positions of the fragments within the base substrate BS. The anti-scattering layer ASL faces the functional layer AL with the base substrate BS therebetween.

The anti-scattering layer ASL is disposed under the base substrate BS in the present embodiment. That is, the anti-scattering layer ASL is closer to the display panel DP than the functional layer AL and the base substrate BS. However, embodiments re not limited thereto. In another embodiment, the anti-scattering layer ASL may be disposed on the base substrate BS to be further from the display panel DP than the base substrate BS.

The anti-scattering layer ASL may include a polymer resin and may have optical transparency. In addition, the anti-scattering layer ASL may also be provided or formed as an adhesive layer for adhering the base substrate BS to another layer within the window WIN which is provided above or under the base substrate BS. In an embodiment, for example, the anti-scattering layer ASL may include or be formed of an optical clear adhesive. The anti-scattering layer ASL is shown as a single layer in FIG. 8. However, embodiments are not limited thereto. In another embodiment, the anti-scattering layer ASL may include a plurality of layers.

The input sensing unit ISP and the display panel DP may be disposed under the anti-scattering layer ASL. Even though not shown in the drawings, the input sensing unit ISP may be adhered to the anti-scattering layer ASL by an adhesive OCA, and thus the input sensing unit ISP together with the display panel DP, may be bonded to the window WIN.

If the first recess RES1 is omitted from the base substrate BS, the base substrate BS may have a single flat top surface in both the transmission area TA and the light blocking area BLA, such that the functional layer AL may be disposed on the single flat top surface of the base substrate BS. In this case, a thickness of a window WIN may be increased, especially at the transmission area TA, due to a sum of a thickness of the base substrate BS and a thickness of the functional layer AL. However, according to one or more embodiment, the functional layer AL may be disposed in the first recess RES1, and thus a total thickness of the window WIN may be reduced, especially at the transmission area TA. A top surface of the functional layer AL may be coplanar with the top surface of the base substrate BS at the light blocking area BLA. A total thickness of the window WIN may be the same at the transmission area TA and at the light blocking area BLA, without being limited thereto.

If a display device DD including the functional layer AL disposed on the base substrate BS having a single flat top surface in both the transmission area TA and the light blocking area BLA, is repeatedly folded or rolled, an edge of the functional layer AL may be peeled or lifted from an edge of the base substrate BS. However, according to one or more embodiment, the functional layer AL may be disposed in the first recess RES1 which is spaced apart from an edge of the base substrate BS, and thus peeling and lifting phenomena of the functional layer AL may be reduced or effectively prevented.

Figure 10:
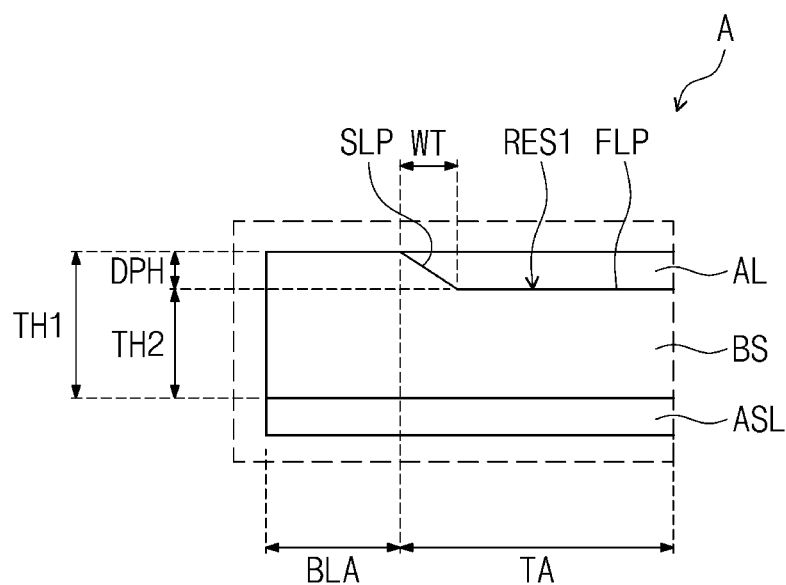
FIG. 10 is an enlarged view of region 'A' of FIG. 8.
Figure 10:
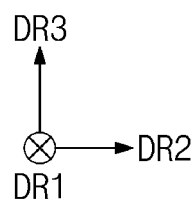

FIG. 10 is an enlarged cross-sectional view of region 'A' of FIG. 8.

Referring to FIG. 10, the base substrate BS may have a first thickness TH1 along the third direction DR3. The third direction DR3 may be defined as a direction perpendicular to the bottom surface of the base substrate BS which is in a plane parallel to a plane defined by the first and second directions DR1 and DR2. Substantially, the first thickness TH1 may be a thickness of the base substrate BS at the light blocking area BLA thereof. The first thickness TH1 may be a maximum thickness of the base substrate BS. The first thickness TH1 may range from about 50 micrometers (μm) to about 500 micrometers (μm).

A portion of the base substrate BS at the transmission area TA, which has the flat portion FLP, may have a second thickness TH2 along the third direction DR3. The second thickness TH2 may range from about 45 micrometers (μm) to about 400 micrometers (μm). A depth DPH of the first recess RES1 along the third direction DR3 may be a value obtained by subtracting the second thickness TH2 from the first thickness TH1.

In a direction of the plane which is defined by the first direction DR1 and the second direction DR2, the inclined portion SLP may have a width WT along the base substrate BS of about 20 micrometers (μm) to about 300 micrometers (μm) along the second direction DR2. In addition, even though not shown in the drawings, the inclined portion SLP may have a width of about 20 micrometers (μm) to about 300 micrometers (μm) along the first direction DR1.

Figure 11:
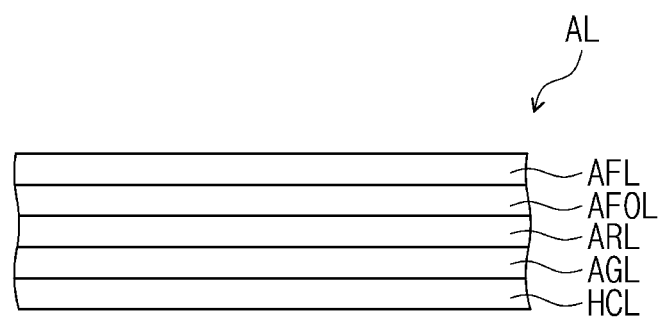
FIG. 11 is an enlarged cross-sectional view illustrating an embodiment of a functional layer of FIG. 8.

FIG. 11 is an enlarged cross-sectional view illustrating an embodiment of a functional layer AL of FIG. 8.

Referring to FIG. 11, the functional layer AL may include a plurality of layers arranged along a thickness direction (e.g., third direction DR3) of the display device DD and/or the window WIN. In an embodiment, for example, the functional layer AL may include a hard coating layer HCL (e.g., hard layer), an anti-glare coating layer AGL (e.g., anti-glare layer), an anti-reflection coating layer ARL (e.g., anti-reflection layer), an anti-fouling coating layer AFOL (e.g., anti-fouling layer), and an anti-fingerprint coating layer AFL (e.g., anti-fingerprint layer).

The hard coating layer HCL, the anti-glare coating layer AGL, the anti-reflection coating layer ARL, the anti-fouling coating layer AFOL and the anti-fingerprint coating layer AFL may be sequentially stacked in order within the first recess RES1, in a direction away from the display panel DP. In an embodiment, for example, the hard coating layer HCL may be disposed in the first recess RES1, and the anti-glare coating layer AGL may be disposed on the hard coating layer HCL. The anti-reflection coating layer ARL may be disposed on the anti-glare coating layer AGL, the anti-fouling coating layer AFOL may be disposed on the anti-reflection coating layer ARL, and the anti-fingerprint coating layer AFL may be disposed on the anti-fouling coating layer AFOL.

Five coating layers are illustrated as an example in FIG. 11. However, the functional layer AL may include one or more of the hard coating layer HCL, the anti-glare coating layer AGL, the anti-reflection coating layer ARL, the anti-fouling coating layer AFOL and the anti-fingerprint coating layer AFL.

The hard coating layer HCL may protect the base substrate BS. In an embodiment, the hard coating layer HCL may have a hardness which is greater than a hardness of the base substrate BS, without being limited thereto. The anti-glare coating layer AGL may reduce glare at the window WIN. The anti-reflection coating layer ARL may reduce or effectively prevent reflection of external light at the window WIN. The anti-fouling coating layer AFOL may minimize or prevent attachment or growth of foreign matter at the window WIN. The anti-fingerprint coating layer AFL may reduce fingerprint at the window WIN.

According to one or more embodiment, the functional layer AL may be disposed in the first recess RES1 extended from the top surface of the base substrate BS. Thus, the thickness of the window WIN may be reduced and the peeling and lifting phenomena of the functional layer AL at an edge of the base substrate BS may be reduced or effectively prevented.

Figure 12:
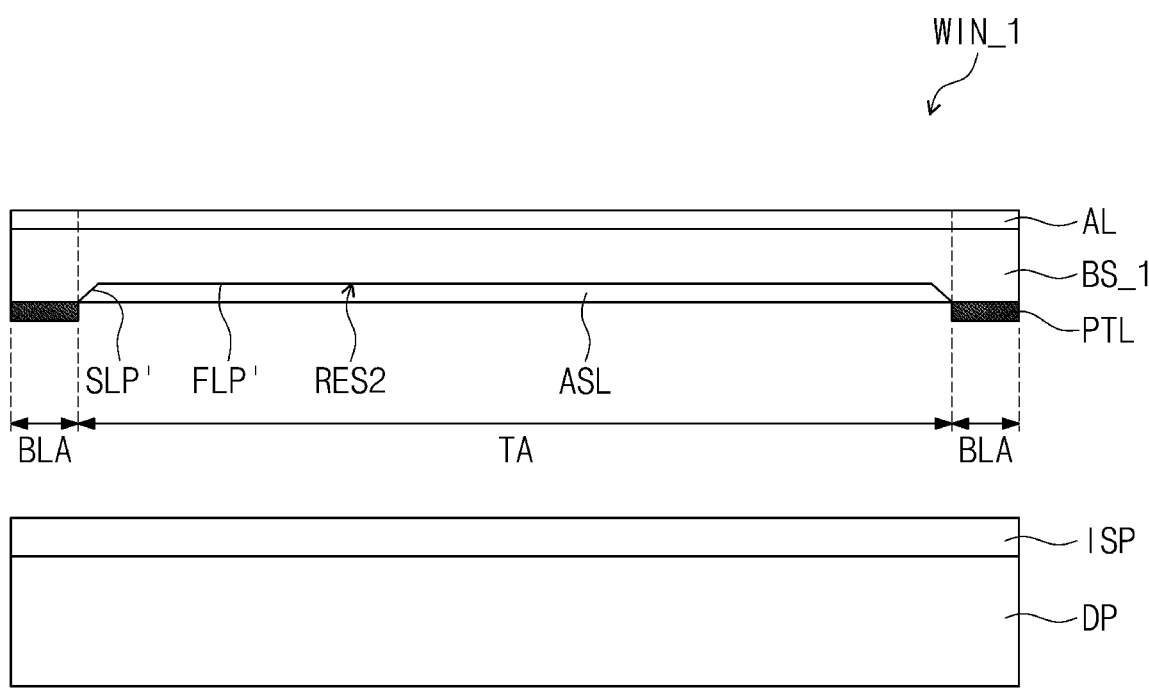
FIG. 12 is a cross-sectional view illustrating an embodiment of a window.
Figure 12:
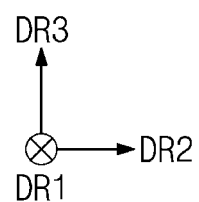

FIG. 12 is a cross-sectional view illustrating an embodiment of a window WIN_1.

A cross-sectional view corresponding to FIG. 8 is illustrated as an example in FIG. 12. For the purpose of ease and convenience in explanation, the display panel DP and the input sensing unit ISP are illustrated together with a window WIN_1 in FIG. 12.

Hereinafter, differences between the window WIN_1 of FIG. 12 and the window WIN of FIG. 8 will be mainly described.

Referring to FIG. 12, the window WIN_1 may include a base substrate BS_1, the functional layer AL disposed on the base substrate BS_1, the anti-scattering layer ASL disposed under the base substrate BS_1, and a printed layer PTL disposed under the base substrate BS_1.

Unlike the base substrate BS illustrated in FIG. 8, a top surface of the base substrate BS_1 in FIG. 12 may be flat in both the transmission area TA and the light blocking area BLA, and a second recess RES2 may be extended from a bottom surface of the base substrate BS_1. The second recess RES2 may include or define portions of a bottom surface of the base substrate BS_1 at the transmission area TA. The anti-scattering layer ASL may be disposed in the second recess RES2. A bottom surface of the anti-scattering layer ASL may be coplanar with the bottom surface of the base substrate BS_1 at the light blocking area BLA. A total thickness of the window WIN_1 may be the same at the transmission area TA and at the light blocking area BLA, without being limited thereto.

The bottom surface of the base substrate BS_1 at the transmission area TA may include a flat portion FLP' (e.g., second flat surface) further from the display panel DP than a bottom surface of the base substrate BS_1 at the light blocking area BLA, and an inclined portion SLP' (e.g., second inclined surface) which is adjacent to the flat portion FLP' such as surrounding the flat portion FLP'. The inclined portion SLP' may be defined by an inclined surface of the base substrate BS_1 which is extended inclined from a boundary between the transmission area TA and the light blocking area BLA, and toward the flat portion FLP'. The second recess RES2 may be defined by the flat portion FLP' together with the inclined portion SLP'. An overall lower surface of the base substrate BS_1 may include the flat portion FLP' and the inclined portion SLP' together with the bottom surface at the light blocking area BLA. Among surfaces of the base substrate BS_2, the bottom surface of the base substrate BS_2 at the light blocking area BLA may be closest to the display panel DP, while the top surface of the base substrate BS_2 at the light blocking area BLA may be furthest from the display panel DP.

The printed layer PTL may be disposed on the bottom surface of the base substrate BS_1 and adjacent to the second recess RES2, such as being around the second recess RES2. In an embodiment, for example, the printed layer PTL may overlap with or correspond to the light blocking area BLA and may be disposed on the bottom surface of the base substrate BS_1 at the light blocking area BLA. The printed layer PTL may protrude from the bottom surface of the base substrate BS_1, to be disposed closer to the display panel DP than both the anti-scattering layer ASL and the bottom surface of the base substrate BS_1.

The anti-scattering layer ASL may not be disposed between the printed layer PTL and the base substrate BS_1 at the light blocking area BLA, but may be disposed in only at the second recess RES2. Thus, the printed layer PTL may be directly on the bottom surface of the base substrate BS_1 at the light blocking area BLA. The printed layer PTL may include a material which is printed directly on the bottom surface of the base substrate BS_1 at the light blocking area BLA.

The printed layer PTL may have a black color and may block light incident to the base substrate BS_1 at the light blocking area BLA. Alternatively, the printed layer PTL may have at least one of other various colors except the black color. An edge of the window WIN_1 may have a color provided by the printed layer PTL, such as by a material which is printed and has a color which blocks light. The printed layer PTL may otherwise be referred to as a light blocking pattern or light blocking layer.

The display panel DP and the input sensing unit ISP may be disposed under the printed layer PTL and the anti-scattering layer ASL. Even though not shown in the drawings, the input sensing unit ISP may be adhered to the anti-scattering layer ASL and/or the printed layer PTL by an adhesive OCA, and thus the input sensing unit ISP together with the display panel DP may be bonded to the window WIN_1.

Since the anti-scattering layer ASL is disposed in the second recess RES2, a thickness of the window WIN_1 may be reduced and the peeling and lifting phenomena of the anti-scattering layer ASL from the base substrate BS_1 may be reduced or effectively prevented.

Figure 13:
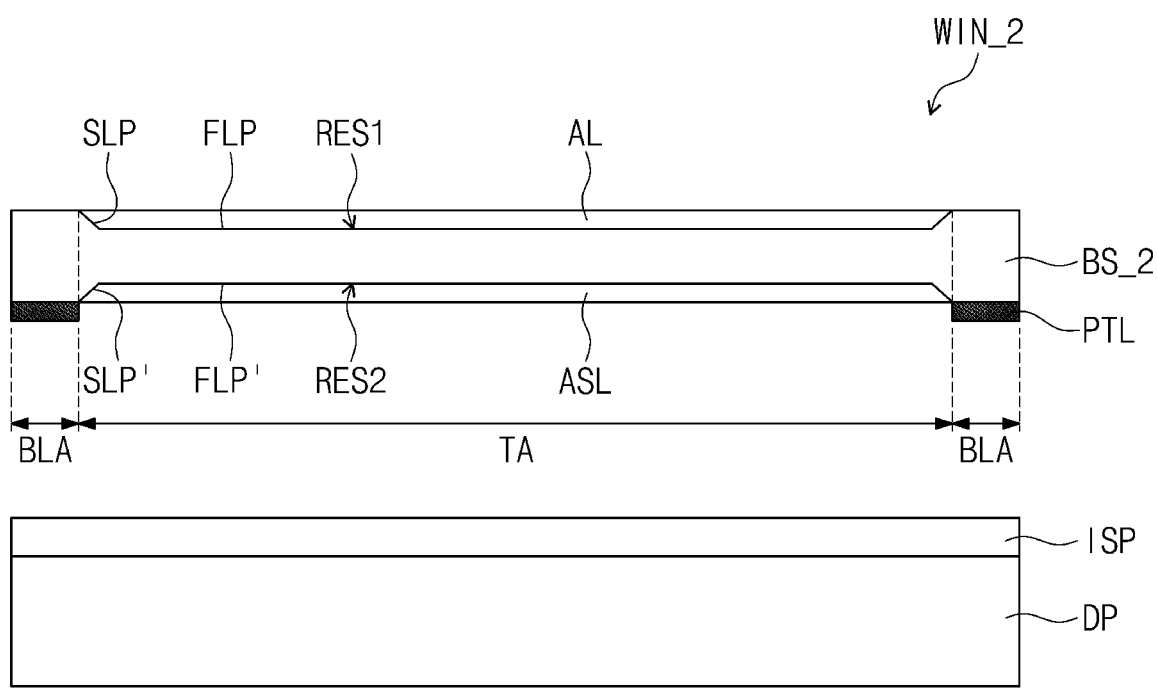
FIG. 13 is a cross-sectional view illustrating an embodiment of a window.

FIG. 13 is a cross-sectional view illustrating an embodiment of a window WIN_2.

A cross-sectional view corresponding to FIG. 8 is illustrated as an example in FIG. 13. For the purpose of ease and convenience in explanation, the display panel DP and the input sensing unit ISP are illustrated together with a window WIN_2 in FIG. 13.

Hereinafter, differences between the window WIN_2 of FIG. 13 and the window WIN of FIG. 8 will be mainly described.

Referring to FIG. 13, the window WIN_2 may include a base substrate BS_2, the functional layer AL disposed above the base substrate BS_2, the anti-scattering layer ASL disposed under the base substrate BS_2, and the printed layer PTL disposed under the base substrate BS_2.

A first recess RES1 may be defined extended from a top surface of the base substrate BS_2, and a second recess RES2 may be extended from a bottom surface of the base substrate BS_2. The first recess RES1 may be defined by upper surfaces of the base substrate BS_2 at the transmission area TA, and the second recess RES2 may be defined by lower surfaces of the base substrate BS_2 at the transmission area TA.

The functional layer AL may be disposed in the first recess RES1, and the anti-scattering layer ASL may be disposed in the second recess RES2. The first recess RES1 may be the same as the first recess RES1 illustrated in FIG. 8, and the second recess RES2 may be the same as the second recess RES2 illustrated in FIG. 12. Thus, first recess RES1 may be defined by the flat portion FLP and the inclined portion SLP, and the second recess RES2 may be defined by the flat portion FLP' and the inclined portion SLP'. The printed layer PTL may be disposed on the bottom surface of the base substrate BS_2 at the light blocking area BLA.

Since the functional layer AL is disposed in the first recess RES1 and the anti-scattering layer ASL is disposed in the second recess RES2, a thickness of the window WIN_2 may be reduced. In addition, the peeling and lifting phenomena of the functional layer AL and the anti-scattering layer ASL at an edge of the base substrate BS_2 may be reduced or effectively prevented.

According to one of more of the embodiments, the functional layer AL may be disposed in the recess defined extended from the top surface of the base substrate BS, and thus the thickness of the window WIN may be reduced. Furthermore, a peeling and lifting phenomena of the functional layer AL which may occur at an edge portion of the functional layer AL may be reduced or effectively prevented.

While the invention has been described with reference to embodiments, it will be apparent to those skilled in the art that various changes and modifications may be made without departing from the spirit and scope of the invention. Therefore, it should be understood that the above embodiments are not limiting, but illustrative. Thus, the scope of the invention are to be determined by the broadest permissible interpretation of the following claims and their equivalents, and shall not be restricted or limited by the foregoing description.

What is claimed is:

1. A window comprising:
a base substrate facing a display panel, the base substrate including:
a transmission area, and
a light blocking area adjacent to the transmission area with a boundary therebetween,
the base substrate defining a first recess which corresponds to the transmission area and is open in a direction away from the display panel, the display panel being outside of the first recess, and
a functional layer which is in the first recess,
wherein the functional layer which is in the first recess both:
includes an anti-glare layer, an anti-reflection layer, an anti-fouling layer or an anti-fingerprint layer, and
has a hardness greater than a hardness of the base substrate.

2. The window of claim 1, wherein
the base substrate further includes:
a top surface which is furthest from the display panel,
an inclined surface extended from the top surface and in a direction from the boundary to the transmission area,
a flat surface extended from an end of the inclined surface, and
a bottom surface opposite to the top surface,
the first recess is defined by the inclined surface together with the flat surface, and
the bottom surface of the base substrate at the transmission area is coplanar with the bottom surface of the base substrate at the light blocking area.

3. The window of claim 2, wherein
the bottom surface of the base substrate defines a plane,
a thickness direction is perpendicular to the plane, and
along the thickness direction, the base substrate at the light blocking area has a thickness of about 50 micrometers to about 500 micrometers.

4. The window of claim 3, wherein along the thickness direction, the base substrate at the flat surface has a thickness of about 45 micrometers to about 400 micrometers.

5. The window of claim 3, wherein in a direction parallel to the plane, the inclined surface has a width of about 20 micrometers to about 300 micrometers.

6. The window of claim 1, wherein the base substrate includes glass.

7. The window of claim 2, wherein the functional layer which is in the first recess extends along both the inclined surface and the flat surface and is in direct contact with both the inclined surface and the flat surface.

8. The window of claim 1, further comprising an anti-scattering layer,
wherein the anti-scattering layer faces the material layer which is in the first recess, with the base substrate therebetween.

9. The window of claim 8, wherein the anti-scattering layer includes an adhesive.

10. The window of claim 8, wherein
the anti-scattering layer is disposed in a second recess defined in a bottom surface of the base substrate.

11. The window of claim 10, further comprising a light blocking layer disposed on the bottom surface of the base substrate at the light blocking area, wherein the light blocking layer is adjacent to the second recess.

12. A display device comprising:
a display panel; and
a window disposed on the display panel,
wherein
the window comprises:
a base substrate including a transmission area, and a light blocking area which is adjacent to the transmission area with a boundary therebetween,
the base substrate defining a first recess which corresponds to the transmission area and is open in a direction away from the display panel, the display panel being outside of the first recess,
a functional layer in the first recess, and
the functional layer which is in the first recess includes an anti-glare layer, an anti-reflection layer, an anti-fouling layer or an anti-fingerprint layer, and
a hardness of the window at the light blocking area is lower than a hardness of the window at the functional layer in the first recess.

13. The display device of claim 12, wherein
the base substrate further includes:
a top surface which is furthest from the display panel, an inclined surface extended from the top surface and in a direction from the boundary to the transmission area, a flat surface extended from an end of the inclined surface, and a bottom surface opposite to the top surface, the first recess is defined by the inclined surface together with the flat surface, and the bottom surface of the base substrate at the transmission area is coplanar with the bottom surface of the base substrate at the light blocking area.

14. The display device of claim 13, wherein
the bottom surface of the base substrate defines a plane,
a thickness direction is perpendicular to the plane,
along the thickness direction:
  the base substrate at the light blocking area has a thickness of about 50 micrometers to about 500 micrometers, and
  the base substrate at the flat surface has a thickness of about 45 micrometers to about 400 micrometers, and
in a direction parallel to the plane the inclined surface has a width of about 20 micrometers to about 300 micrometers.

15. The display device of claim 13, wherein the functional layer which is in the first recess extends along both the inclined surface and the flat surface and is in direct contact with both the inclined surface and the flat surface.

16. The display device of claim 12, further comprising an anti-scattering layer between the display panel and the substrate of the window,
wherein the anti-scattering layer faces the functional layer with the base substrate therebetween.

17. The display device of claim 16, wherein
the anti-scattering layer is disposed in a second recess defined in a bottom surface of the base substrate.

18. A display device comprising:
a display panel; and
a window disposed on the display panel,
wherein the window comprises:
  a base substrate including a transmission area, and a light blocking area which is adjacent to the transmission area with a boundary therebetween,
  the base substrate defining corresponding to the transmission area:
    a top surface which is furthest from the display panel,
    a first recess extended from the top surface of the base substrate and open in a direction away from the display panel, and
    a second recess open in a direction toward the display panel, the display panel being outside of the first recess and the second recess,
  a functional layer which is in the first recess, the functional layer which is in the recess including an anti-glare layer, an anti-reflection layer, an anti-fouling layer or an anti-fingerprint layer and having a top surface which is furthest from the display panel,
  a flat top surface of the window defined by a top surface of the base substrate at the light blocking area, together with a top surface of the functional layer at the transmission area, and
  an anti-scattering layer in the second recess.

19. The display device of claim 18, further comprising a light blocking layer disposed on a bottom surface of the base substrate at the light blocking area, wherein the light blocking layer is adjacent to the second recess.

* * * * *